US009577134B2

(12) United States Patent
Weidman (10) Patent No.: US 9,577,134 B2
(45) Date of Patent: Feb. 21, 2017

(54) SOLAR CELL EMITTER REGION FABRICATION USING SELF-ALIGNED IMPLANT AND CAP

(71) Applicant: Timothy Weidman, Sunnyvale, CA (US)

(72) Inventor: Timothy Weidman, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 256 days.

(21) Appl. No.: 14/100,540

(22) Filed: Dec. 9, 2013

(65) Prior Publication Data
US 2015/0162484 A1 Jun. 11, 2015

(51) Int. Cl.
*H01L 31/068* (2012.01)
*H01L 31/0216* (2014.01)
(Continued)

(52) U.S. Cl.
CPC ....... *H01L 31/068* (2013.01); *H01L 31/02167* (2013.01); *H01L 31/022441* (2013.01);
(Continued)

(58) Field of Classification Search
CPC ...... H01L 31/0216; H01L 21/00; H01L 31/18; H01L 31/032; H01L 31/0224; H01L 31/0322; H01L 31/0272; H01L 2924/00; H01L 2924/0002; H01L 31/0725; H01L 31/035281; H02S 40/44; H02S 30/20; Y02E 10/542; Y02E 10/541; Y02E 10/50; Y02E 10/549; Y02E 10/547; Y02E 10/543; Y02E 10/52
(Continued)

(56) References Cited

U.S. PATENT DOCUMENTS

| 2,695,852 A | 11/1954 | Sparks |
| 3,736,425 A | 5/1973 | Chernow |

(Continued)

FOREIGN PATENT DOCUMENTS

KR 102011002006 3/2011

OTHER PUBLICATIONS

Lu, Nicky C., et al., "Modeling and Optimization of Monolithic Polycrystalline Silicon Resistors", IEEE Transactions on Electron Devices, vol. ED-28, No. 7, Jul. 1981, pp. 818-830.
(Continued)

*Primary Examiner* — Joshua King
(74) *Attorney, Agent, or Firm* — Blakely Sokoloff Taylor Zafman LLP (57) ABSTRACT

Methods of fabricating solar cell emitter regions using self-aligned implant and cap, and the resulting solar cells, are described. In an example, a method of fabricating an emitter region of a solar cell involves forming a silicon layer above a substrate. The method also involves implanting, through a stencil mask, dopant impurity atoms in the silicon layer to form implanted regions of the silicon layer with adjacent non-implanted regions. The method also involves forming, through the stencil mask, a capping layer on and substantially in alignment with the implanted regions of the silicon layer. The method also involves removing the non-implanted regions of the silicon layer, wherein the capping layer protects the implanted regions of the silicon layer during the removing. The method also involves annealing the implanted regions of the silicon layer to form doped polycrystalline silicon emitter regions.

17 Claims, 11 Drawing Sheets

(51) Int. Cl.
*H01L 31/0224* (2006.01)
*H01L 31/0352* (2006.01)
*H01L 31/18* (2006.01)

(52) U.S. Cl.
CPC .... *H01L 31/035272* (2013.01); *H01L 31/182* (2013.01); *H01L 31/1876* (2013.01); *Y02E 10/546* (2013.01); *Y02E 10/547* (2013.01); *Y02P 70/521* (2015.11)

(58) Field of Classification Search
USPC .... 430/5, 323, 313, 321, 322; 438/5, 19, 38, 438/48, 57, 60–62, 69, 73, 72, 74–75, 85, 89, 438/93, 96, 298, 455, 462, 478, 480, 479, 516, 438/510, 514, 527, 528, 529, 530, 531, 551, 438/758, 759, 766, 778, 786, 943, 945, 947; 250/217, 492.21, 492.2, 492, 423, 424, 250/425; 427/4, 38, 74, 76, 282, 248.1; 257/255.28, 64, 65, 66, 231, 232, 241, 347, 257/617, E21.09, E21.24, E21.266, E21.292, 257/E21.346, E31.032, 572, 579, 591; 204/192.28; 148/1.5, 175, 187
See application file for complete search history.

(56) References Cited

U.S. PATENT DOCUMENTS

| | | | |
|---|---|---|---|
| 3,790,412 A | 2/1974 | Moline | |
| 4,086,102 A | 4/1978 | King | |
| 4,381,956 A | 5/1983 | Lane | |
| 4,448,797 A | 5/1984 | Burnham | |
| 4,448,865 A | 5/1984 | Bohlen et al. | |
| 4,557,037 A | 12/1985 | Hanoka et al. | |
| 5,907,766 A | 5/1999 | Swanson et al. | |
| 5,972,794 A * | 10/1999 | Katakura | G03F 1/20 216/12 |
| 6,087,274 A | 7/2000 | Tonucci et al. | |
| 6,253,441 B1 * | 7/2001 | Wheat | C23C 4/005 118/504 |
| 6,335,534 B1 | 1/2002 | Suguro et al. | |
| 6,417,078 B1 | 7/2002 | Dolan et al. | |
| 6,614,033 B2 | 9/2003 | Suguro et al. | |
| 7,094,612 B2 | 8/2006 | Shibata et al. | |
| 7,179,569 B2 | 2/2007 | Suguro et al. | |
| 7,208,381 B2 | 4/2007 | Lee | |
| 7,459,246 B2 | 12/2008 | Suguro et al. | |
| 7,531,216 B2 | 5/2009 | Brody | |
| 7,638,438 B2 | 12/2009 | Eldershaw | |
| 7,727,866 B2 | 6/2010 | Bateman et al. | |
| 7,745,073 B2 | 6/2010 | Suguro et al. | |
| 7,816,239 B2 | 10/2010 | Blake et al. | |
| 7,820,460 B2 | 10/2010 | Sullivan et al. | |
| 7,838,062 B2 * | 11/2010 | Cousins | H01L 21/76802 427/466 |
| 7,888,249 B2 | 2/2011 | Bateman et al. | |
| 8,222,053 B2 | 7/2012 | Sullivan et al. | |
| 8,420,435 B2 | 4/2013 | Rana et al. | |
| 8,440,571 B2 | 5/2013 | Weidman et al. | |
| 8,470,616 B2 | 6/2013 | Sullivan et al. | |
| 8,563,352 B2 * | 10/2013 | Hiliali | H01L 31/0236 257/E31.13 |
| 2004/0112426 A1 | 6/2004 | Hagino | |
| 2008/0072953 A1 | 3/2008 | Stephens et al. | |
| 2009/0068783 A1 | 3/2009 | Borden | |
| 2009/0227061 A1 | 9/2009 | Bateman et al. | |
| 2009/0263928 A1 | 10/2009 | Tseng | |
| 2009/0309039 A1 | 12/2009 | Adibi et al. | |
| 2010/0055822 A1 * | 3/2010 | Weidman | G01T 1/2018 438/57 |
| 2010/0184250 A1 | 7/2010 | Blake et al. | |
| 2011/0104618 A1 * | 5/2011 | Bateman | H01L 21/266 430/326 |
| 2011/0139230 A1 | 6/2011 | Rohatgi et al. | |
| 2012/0122302 A1 | 5/2012 | Weidman et al. | |
| 2013/0065404 A1 | 3/2013 | Weidman et al. | |
| 2013/0071580 A1 | 3/2013 | Weidman et al. | |
| 2013/0171767 A1 | 7/2013 | Moslehi et al. | |
| 2013/0213469 A1 * | 8/2013 | Kramer | H01L 31/02245 136/256 |
| 2014/0154834 A1 | 6/2014 | Bateman et al. | |

OTHER PUBLICATIONS

Meier, D. L., et al., "Aluminum alloy back p-n junction dendritic web silicon solar cell", Elsevier, Solar Energy Materials & Solar Cells 65 (2001), pp. 621-627.

Nishihashi, T., et al., "Ion-graphy implanter with stencil mask", Journal of Vacuum Science & Technology B20, 914 (2002); doi: 10.1116/1.1475982, 5 pgs.

Rusop, M., et al., "Photoelectrical properties of pulsed laser deposited boron doped p-carbon/n-silicon and phosphorus doped n-carbon/p-silicon heterojunction solar cells", Elsevier, Solar Energy 78 (2005) pp. 406-415.

Tonari, Kazuhiko, et al., "Stencil mask Ion Implantation Technology for realistic approach to wafer process", AIP Conference Proceedings 866, 401 (2006); doi; 10.1063/1.2401541, 5 pgs.

Wang, Qi, et al., "Combinatorial synthesis of solid state electronic materials for renewable energy applications", Elsevier, Applied Surface Science 189 (2002), pp. 271-276.

A. Soderbarg, "Fabrication of BESOI-Materials Using Implanted Nitrogen as an Effective Etch Stop Barrier," Uppsala University, SOS/SOI Technology Conference, Stateline, Nevada, Oct. 3-5, 1989, 2 pages.

Lehmann, V. et al., "Implanted Carbon: An Effective Etch-Stop in Silicon," J. Electrochem. Soc., vol. 138, No. 5, May 1991, 2 pages.

International Search Report and Written Opinion from PCT/US2014/067497 mailed Mar. 13, 2015, 15 pgs.

* cited by examiner

SOLAR CELL EMITTER REGION FABRICATION USING SELF-ALIGNED IMPLANT AND CAP

TECHNICAL FIELD

Embodiments of the present disclosure are in the field of renewable energy and, in particular, methods of fabricating solar cell emitter regions using self-aligned implant and cap, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions using self-aligned implant and cap, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating an emitter region of a solar cell involves forming a silicon layer above a substrate. The method also involves implanting, through a stencil mask, dopant impurity atoms in the silicon layer to form implanted regions of the silicon layer with adjacent non-implanted regions. The method also involves forming, through the stencil mask, a capping layer on and substantially in alignment with the implanted regions of the silicon layer. The method also involves removing the non-implanted regions of the silicon layer, wherein the capping layer protects the implanted regions of the silicon layer during the removing. The method also involves annealing the implanted regions of the silicon layer to form doped polycrystalline silicon emitter regions.

In another embodiment, a method of fabricating alternating N-type and P-type emitter regions of a solar cell involves forming a polycrystalline silicon layer on a thin oxide layer disposed on a monocrystalline silicon substrate. The method also involves implanting, through a first stencil mask, dopant impurity atoms of a first conductivity type in the polycrystalline silicon layer to form first implanted regions of the polycrystalline silicon layer adjacent to non-implanted regions. The method also involves forming, through the first stencil mask, a first capping layer on and substantially in alignment with the first implanted regions of the polycrystalline silicon layer. The method also involves implanting, through a second stencil mask, dopant impurity atoms of a second, opposite, conductivity type in portions of the non-implanted regions of the polycrystalline silicon layer to form second implanted regions of the polycrystalline silicon layer and resulting in remaining non-implanted regions. The method also involves forming, through the second stencil mask, a second capping layer on and substantially in alignment with the second implanted regions of the polycrystalline silicon layer. The method also involves removing the remaining non-implanted regions of the polycrystalline silicon layer, wherein the first and second capping layers protect the first implanted regions and the second implanted regions, respectively, of the polycrystalline silicon layer during the removing. The method also involves annealing the first implanted regions and the second implanted regions of the polycrystalline silicon layer to form doped polycrystalline silicon emitter regions.

Also disclosed herein are apparatuses for fabricating solar cells. In one embodiment, an in-line process apparatus for fabricating an emitter region of a solar cell includes a first station for aligning a stencil mask with a substrate. A second station is included for implanting dopant impurity atoms above the substrate, through the stencil mask. A third station is included for forming a capping layer above the substrate, through the stencil mask. The stencil mask and the substrate can be moved together through the second and third stations.

One or more embodiments described herein provides a simplified process flow for fabricating high efficiency, all back-contact solar cell devices involving the use of ion implant technology for generating both N+ (e.g., typically phosphorus or arsenic doped) and P+ (e.g., typically boron doped) polysilicon emitter layers. In one embodiment, a fabrication approach involves the use of patterned shadow masks, preferably fabricated from silicon (Si), placed in close proximity or direct physical contact with the solar cell substrate being processed. In one such embodiment, the shadow mask moves with the substrate, first under an implant beam, and next (without moving the shadow mask) through a second processing zone/region where a sufficient thickness of a capping layer is deposited directly over and perfectly (or at least substantially) aligned with the implanted area. A same or similar process can then be applied to generate similarly capped patterns of a dopant type having opposite conductivity.

Some embodiments involve the composition of the capping layer as selected such that a selective wet or dry etch removal of adjacent non-implanted (and, therefore, also uncapped) polysilicon layer is enabled. Such etch selectivity permits patterned trench isolation between emitter regions of, e.g., a back contact solar cell. In some examples, the capping film may consist of a $SiO_2$ or $SiN$ (or a combination thereof) dielectric based-films, deposited using low pressure chemical vapor deposition (LPCVD), plasma enhanced chemical vapor deposition (PECVD) or high density plasma chemical vapor deposition (HDPCVD). In one embodiment, HDPCVD may be preferred due to the more directional nature of the deposition and lower operating pressures more compatible with the preceding ion implant operation. However, the capping layer may also be deposited using an even higher vacuum physical vapor deposition (PVD) or sputtering based process permitting a more directional, collimated deposition of $SiO_2$, $SiON$, or $SiN$ based dielectric capping layers that provide good wet etch selectivity even when applied at relatively low temperatures (such as between room temperature and 400 C).

In particular embodiments, the as-deposited capping layer is sufficiently resistant to alkaline-based silicon etch and texturing chemistries to allow for complete removal of all non-implanted (and therefore also non-capped) polysilicon regions. The alkaline-based silicon etch and texturing chemistries are thus used to form trenches that isolate oppositely doped poly-Si regions, with the simultaneous texturing of the front (sun-facing) side of the wafer. In one embodiment, once the front side texturing and trench isolation etch is complete, a subsequent wet etch chemistry such as a hydrofluoric acid (HF) based chemistry (e.g., an $NH_4F$ buffered HF mixture, or buffered oxide etchant (BOE)) is applied to strip the residual capping layer. In an alternative embodiment, however, the capping layer is a metallic layer with sufficient resistance to an alkaline chemistry. Such a metallic layer may remain in the device as a contact layer.

To provide further context, there has been recent significant interest and progress towards the delivery of lower cost and higher throughput ion implant systems applicable to solar cell fabrication with particular promise to interdigitated back contact (IBC) type solar cells. The assumption is that both N+ and P+ implants could be accomplished with good alignment. However, in order to be applicable to high performance back contact type solar cell structures using a process flow that could actually reduce process steps, costs, and thermal budget, an approach is required that provides not only for cost effectively providing patterned and aligned ion implants but also the selective or self aligned removal of non-implanted polycrystalline silicon regions. Addressing such concerns, one or more embodiments described herein provides such functionality by employing relatively low cost, non-contaminating silicon wafer stencil masks for applying both patterned ion implants and self-aligned capping layers in a single sequence through the same mask. Since the mask, like the silicon wafer substrate, is composed of silicon it can be employed in contact mode without contamination issues or problems associated with different coefficients of thermal expansion. In an embodiment, masking or stencil wafers can be sufficiently doped so as to be conducting and therefore be included as an integral part of the ion beam shaping electronics (or merely to avoid charging). Furthermore, by automatically performing the deposition of a dielectric layer after each ion implant operation, subsequent implants can be blocked (e.g., stopped and trapped in) the surface dielectric, greatly facilitating the periodic cleaning and reuse of such stencil masks.

More specifically, like other patterning processes requiring the use of stencil masks, generating masks with sufficient mechanical integrity may place significant restrictions on the types of patterns employed, or may require that the desired pattern for each implant polarity be performed in two separate and perfectly aligned steps (e.g., using a total of four separate masks). One such scenario that may be impacted is the fabrication of interdigitation using long fingers extending nearly the length of the solar cell. However, in accordance with embodiments described herein, other possible interdigitation layouts are described that may be less challenging. For example, as described in greater detail below, using alternative multibusbar designs may provide distinct advantages when migrating to next generation (e.g., lower cost) metallization strategies.

In an exemplary process flow, FIGS. 1A-1F illustrate cross-sectional views of various stages in the fabrication of a solar cell, in accordance with an embodiment of the present disclosure. FIG. 2 is a flowchart 200 listing operations in a method of fabricating a solar cell as corresponding to FIGS. 1A-1F, in accordance with an embodiment of the present disclosure.

Figure 1A:
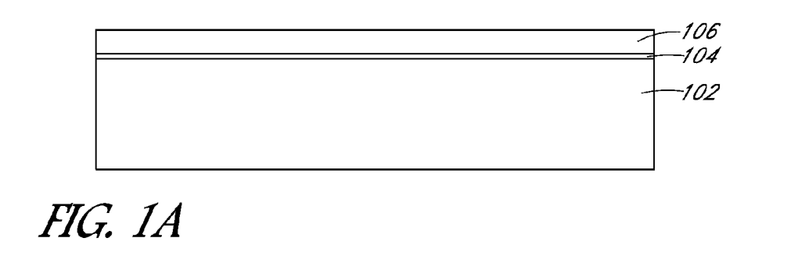
FIGS. 1A-1F illustrate cross-sectional views of various stages in the fabrication of a solar cell, in accordance with an embodiment of the present disclosure.
Figure 2:
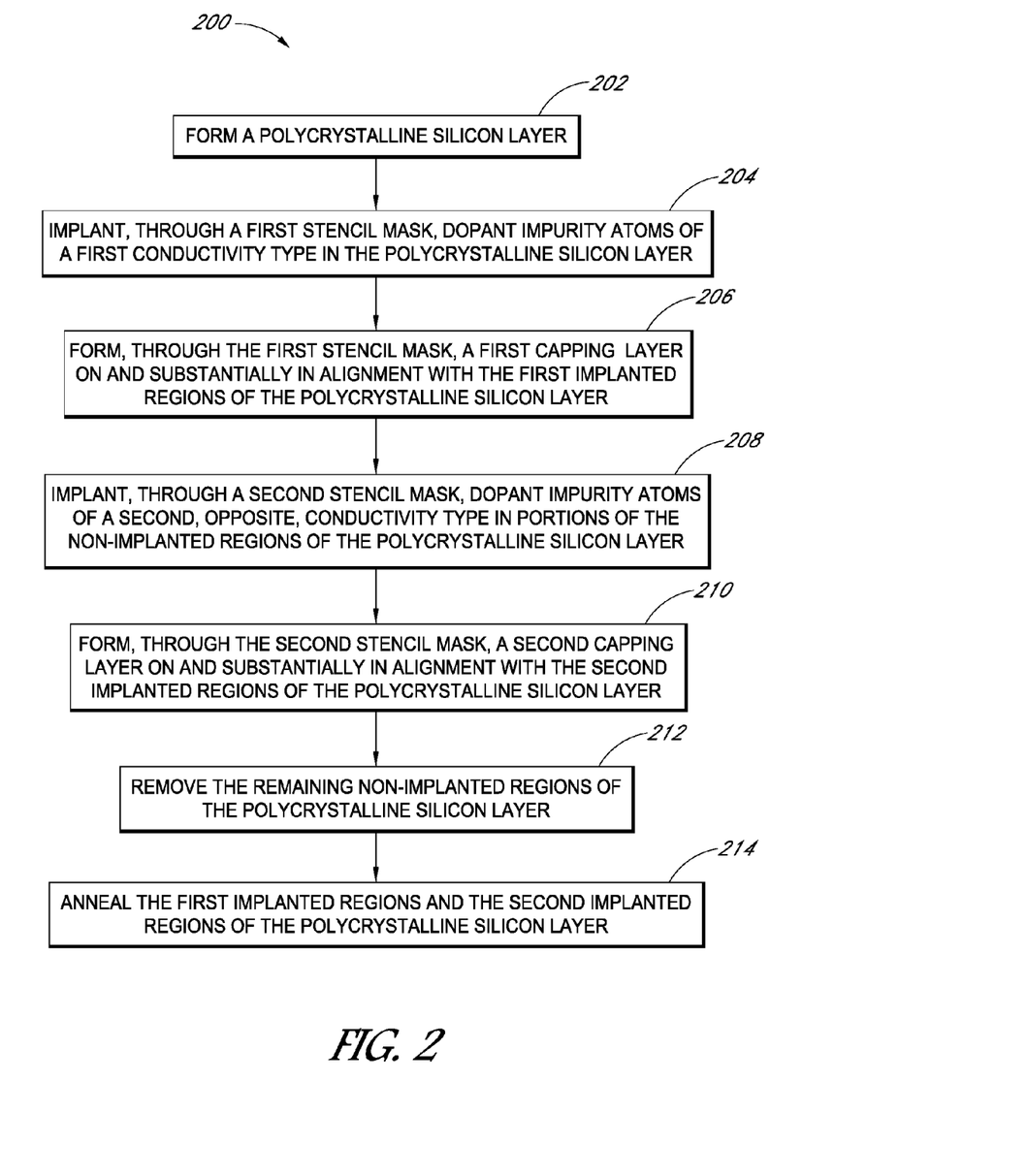
FIG. 2 is a flowchart listing operations in a method of fabricating a solar cell as corresponding to FIGS. 1A-1F, in accordance with an embodiment of the present disclosure.

Referring to FIG. 1A and corresponding operation 202 of flowchart 200, a method of fabricating alternating N-type and P-type emitter regions of a solar cell involves forming a polycrystalline silicon layer 106 on a thin oxide layer 104 disposed on a substrate 102.

In an embodiment, the substrate 102 is a monocrystalline silicon substrate, such as a bulk single crystalline N-type doped silicon substrate. It is to be understood, however, that substrate 102 may be a layer, such as a multi-crystalline silicon layer, disposed on a global solar cell substrate. In an embodiment, the thin oxide layer is a tunnel dielectric silicon oxide layer having a thickness of approximately 2 nanometers or less. Although described as a polycrystalline silicon layer 106, in an alternative embodiment, an amorphous silicon layer is used instead.

Figure 1B:
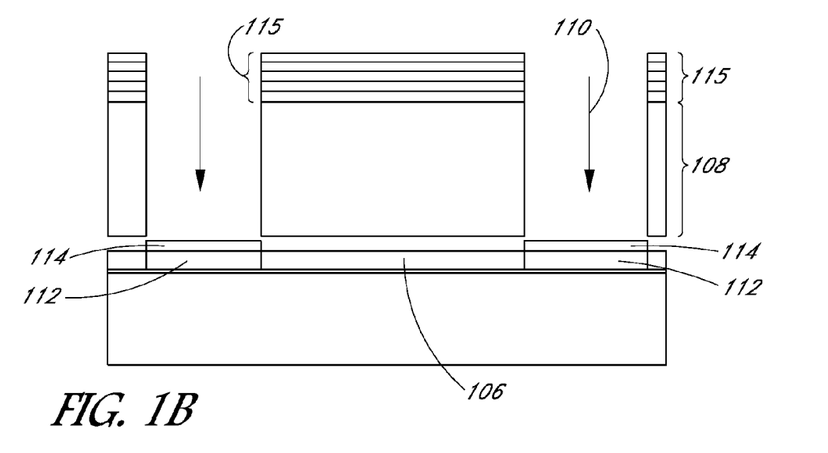

Referring to FIG. 1B and corresponding operation 204 of flowchart 200, the method also involves implanting, through a first stencil mask 108, dopant impurity atoms of a first conductivity type 110 in the polycrystalline silicon layer 106 to form first implanted regions 112 of the polycrystalline silicon layer 106 and non-implanted regions (i.e., remaining portions of polycrystalline silicon layer 106 that have not been implanted at this stage in the process).

In an embodiment, the first stencil mask 108 is a silicon stencil mask. In one embodiment, use of a silicon stencil mask enables placement on, or in close proximity to, the structure of FIG. 1A since the silicon of the stencil mask does not contaminate a silicon based solar cell. In an embodiment, the implanting is performed by using ion beam implantation or plasma immersion implantation. In one embodiment, this first implanting provides P+ dopant atoms for silicon (e.g., boron atoms). In another embodiment, however, the first implanting provides N+ dopant atoms for silicon (e.g., phosphorus atoms or arsenic atoms). In an embodiment, the conditions used to perform the implantation are tuned (e.g., by sequential or simultaneous electron bombardment) to enhance subsequent etch selectivity between implanted and non-implanted regions, as pertaining to later operations described below. Other conditions that may be tuned can include one or more of substrate biasing during implantation, temperature tuning, and dose tuning.

Referring again to FIG. 1B and now to corresponding operation 206 of flowchart 200, the method also involves forming, through the first stencil mask 108, a first capping layer 114 on and substantially in alignment with the first implanted regions 112 of the polycrystalline silicon layer 106. The alignment can be viewed as ideally perfect since the stencil mask and substrate travel together. However, the process can tolerate some slight offset (e.g., less than a few percent in a translational direction) that may occur while the process is moved from an implant/doping chamber to a cap deposition chamber.

Figure 5A:
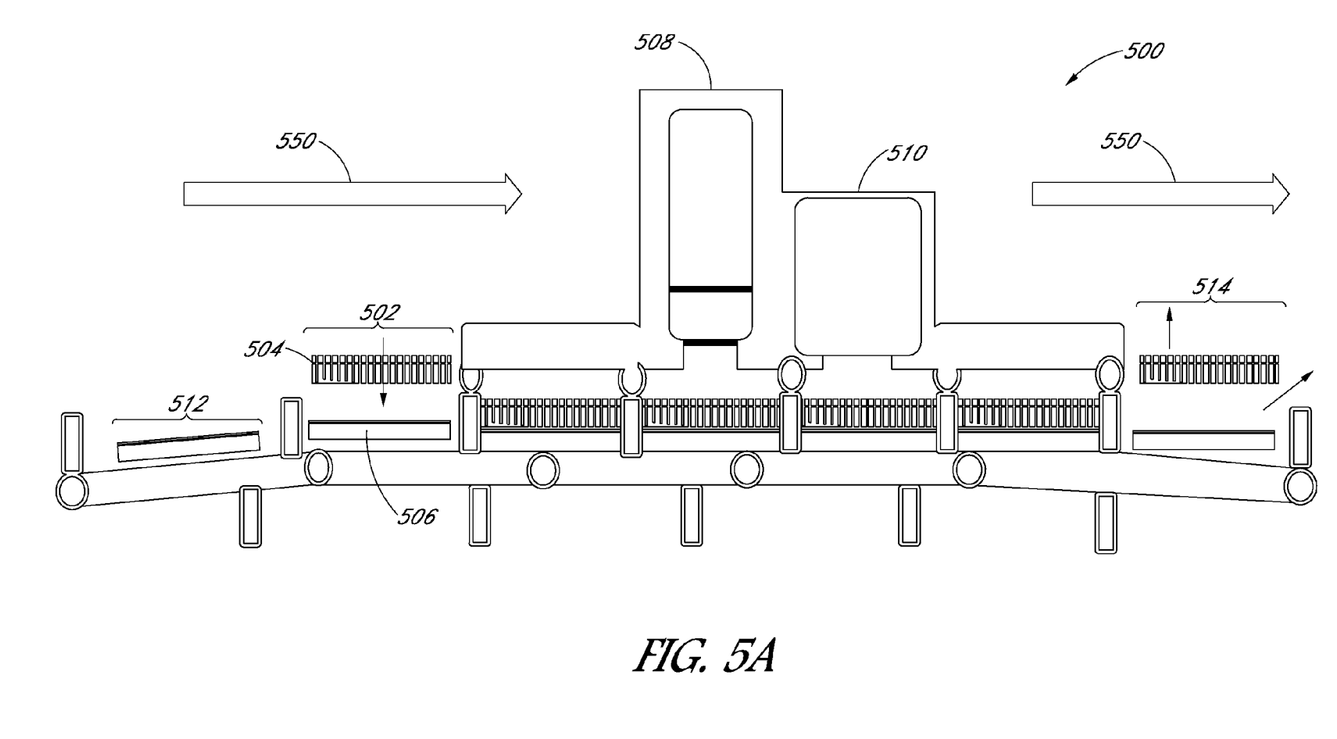
FIG. 5A schematically illustrates a cross-sectional view of an inline platform for patterned implant and capping, in accordance with an embodiment of the present disclosure.
Figure 5B:
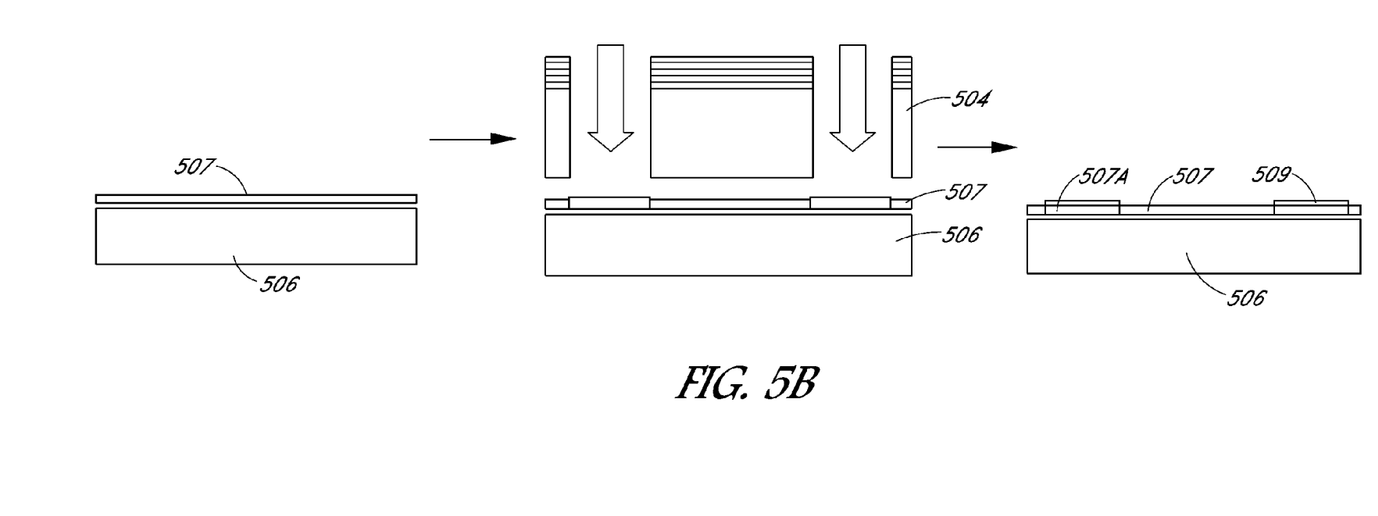
FIG. 5B illustrates an implant and capping sequence through silicon contact masks in the apparatus of FIG. 5A, in accordance with an embodiment of the present disclosure.

In an embodiment, the implanting and the forming of the first capping layer 114 are performed in an in-line process apparatus in which the first stencil mask 108 and the monocrystalline silicon substrate 102 are moved together through the in-line process apparatus, as described in greater detail in association with FIGS. 5A and 5B. In an embodiment, the first capping layer 114 includes a material such as, but not limited to, silicon dioxide ($SiO_2$), silicon nitride (SiN) or silicon oxynitride (SiON). In an embodiment, the first capping layer 114 is formed using a deposition technique such as, but not limited to, low pressure chemical vapor deposition (LPCVD), plasma enhanced chemical vapor deposition (PECVD), high density plasma chemical vapor deposition (HDPCVD) or physical vapor deposition (PVD). In an embodiment, the first capping layer 114 is formed by deposition at a temperature approximately in the range of 25-400 degrees Celsius.

Referring again to FIG. 1B, the material of capping layer 114 may also be deposited on the first stencil mask 108. After numerous runs of the stencil mask 108 through the deposition environment, multiple material layers may ultimately accumulate, as is depicted in FIG. 1B. It is to be appreciated that an optimal number of runs may be determined to balance throughput against an over-accumulation of material on the stencil mask 108 that could in some way impact later deposition processes. In one such embodiment, after a certain number of runs, the accumulated capping material is removed by selective etching, and the first stencil mask 108 can then be reused.

Figure 1C:
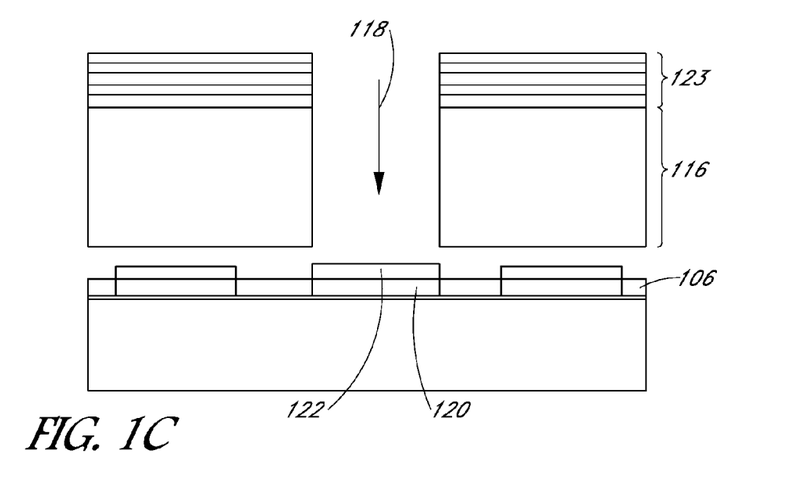

Referring to FIG. 1C and corresponding operation 208 of flowchart 200, the method also involves implanting, through a second stencil mask 116, dopant impurity atoms of a second, opposite, conductivity type 118 in portions of the non-implanted regions of the polycrystalline silicon layer 106 to form second implanted regions 120 of the polycrystalline silicon layer 106 and remaining non-implanted regions (i.e., remaining portions of polycrystalline silicon layer 106 that have not been implanted).

In an embodiment, the second stencil mask 116 is a silicon stencil mask. In one embodiment, use of a silicon stencil mask enables placement on, or in close proximity to, the structure of FIG. 1B since the silicon of the stencil mask does not contaminate a silicon based solar cell. In an embodiment, the implanting is performed by using ion beam implantation or plasma immersion implantation. In one embodiment, this second implanting provides N+ dopant atoms for silicon (e.g., phosphorus atoms or arsenic atoms). In another embodiment, however, the second implanting provides P+ dopant atoms for silicon (e.g., boron atoms). In an embodiment, the conditions used to perform the implantation are tuned (e.g., by sequential or simultaneous electron bombardment) to enhance subsequent etch selectivity between implanted and non-implanted regions, as pertaining to later operations described below. Other conditions that may be tuned can include one or more of substrate biasing during implantation, temperature tuning, and dose tuning.

Referring again to FIG. 1C and now to corresponding operation 210 of flowchart 200, the method also involves forming, through the second stencil mask 116, a second capping layer 122 on and substantially in alignment with the second implanted regions 120 of the polycrystalline silicon layer 106. The alignment can be viewed as ideally perfect since the stencil mask and substrate travel together. However, the process can tolerate some slight offset (e.g., less than a few percent in a translational direction) that may occur while the process is moved from an implant/doping chamber to a cap deposition chamber.

In an embodiment, the implanting and the forming of the second capping layer 122 are performed in an in-line process apparatus in which the second stencil mask 116 and the monocrystalline silicon substrate 102 are moved together through the in-line process apparatus, as described in greater detail in association with FIGS. 5A and 5B. In an embodiment, the second capping layer 122 includes a material such as, but not limited to, silicon dioxide (SiO$_2$), silicon nitride (SiN) or silicon oxynitride (SiON). In an embodiment, the second capping layer 122 is formed using a deposition technique such as, but not limited to, low pressure chemical vapor deposition (LPCVD), plasma enhanced chemical vapor deposition (PECVD), high density plasma chemical vapor deposition (HDPCVD) or physical vapor deposition (PVD). In an embodiment, the second capping layer 122 is formed by deposition at a temperature approximately in the range of 25-400 degrees Celsius.

Referring again to FIG. 1C, the material of second capping layer 122 may also be deposited on the second stencil mask 116. As was the case with the first capping layer on the first stencil mask, after numerous runs of the second stencil mask 116 through the deposition environment, multiple material layers may ultimately accumulate, as is depicted in FIG. 1C. It is to be appreciated that an optimal number of runs may be determined to balance throughput against an over-accumulation of material on the stencil mask 116 that could in some way impact later deposition processes. In one such embodiment, after a certain number of runs, the accumulated capping material is removed by selective etching, and the second stencil mask 116 is then reused.

Figure 1D:
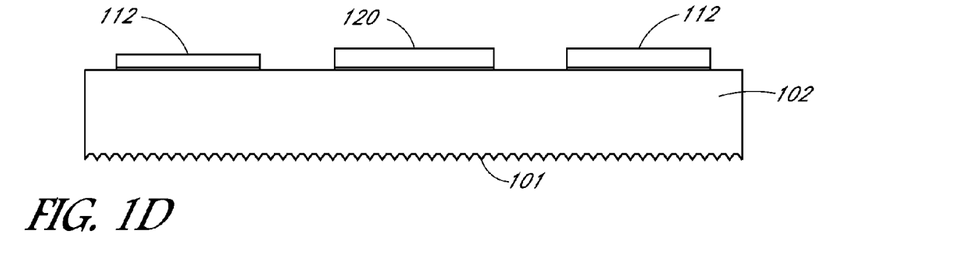

Referring to FIG. 1D and corresponding operation 212 of flowchart 200, the remaining non-implanted regions of the polycrystalline silicon layer 106 can be removed. In an embodiment, the first capping layer 114 and the second capping layer 122 protect the first implanted regions 112 and the second implanted regions 120, respectively, during removal of the remaining non-implanted portions of the polycrystalline silicon layer 106. In an embodiment, referring again to FIG. 1D, subsequent to and/or during the removal of the remaining non-implanted portions of the polycrystalline silicon layer 106, the capping layers 114 and 122 can also be removed. In either case, the capping layers 114 and 122 should be suitably less susceptible to the etch than the polycrystalline silicon layer 106 in order to provide at least a substantial amount of protection of the first implanted regions 112 and the second implanted regions 120 (e.g., without significantly eroding the implanted regions).

In an embodiment, the first and second capping layers 114 and 122 include a material such as, but not limited to, silicon dioxide (SiO$_2$), silicon nitride (SiN) or silicon oxynitride (SiON), and removing the remaining non-implanted regions of the polycrystalline silicon layer 106 involves using a hydroxide-based wet etch process. In one embodiment, the first and second capping layers 114 and 122 are then removed in a subsequent process using an HF-based wet etch process, such as a buffered oxide etchant (BOE) process.

Figure 1E:
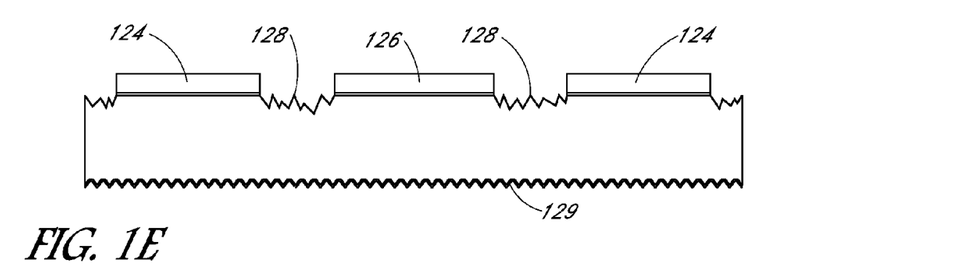

Referring to FIG. 1E and corresponding operation 214 of flowchart 200, the first implanted regions 112 and the second implanted regions 120 of the polycrystalline silicon layer can be annealed to form first 124 and second 126 doped polycrystalline silicon emitter regions, respectively. While it may be generally most advantageous to complete the etch (i.e. removal) of non-implanted areas of polysilicon prior to performing a high temperature anneal and activation process, certain implant conditions may result in intrinsically higher reactivity in the texturizing etch (e.g., as relative to non-implanted regions), in which case a high temperature anneal can be performed prior to trench etch.

In an embodiment, the heating is performed at a temperature approximately in the range of 850-1100 degrees Celsius for a duration approximately in the range of 1-100 minutes. In an embodiment, a light P+ dopant drive is performed during the heating or annealing.

Referring to both FIGS. 1D and 1E, in an embodiment, trenches 128 are formed between the first 124 and second 126 doped polycrystalline silicon emitter regions. Furthermore, in an embodiment, the trenches and/or the light receiving surface 101 of the substrate 102 are texturized. The ordering of operations of the trench formation and the annealing of the first implanted regions 112 and the second implanted regions 120 of the polycrystalline silicon layer to form first 124 and second 126 doped polycrystalline silicon emitter regions can be varied. In one embodiment, the trench formation and the texturizing are both performed in a same hydroxide-based etch process prior to the annealing, e.g., as part of the process used to remove non-implanted regions of the silicon layer 106. Alternatively, the trench formation and the texturizing are performed subsequent to the annealing (as is depicted in FIGS. 1D and 1E). In yet another embodiment, texturizing of surface 101 may be performed in an operation different from the operation used to form and texturize trenches 128. It is to be appreciated that a texturized surface may be one which has a regular or an irregular shaped surface for scattering incoming light, decreasing the amount of light reflected off of the light-receiving surface of the solar cell. Additional embodiments can include formation of a passivation or anti-reflective coating layer 129 on the light-receiving surface 101, as depicted in FIG. 1E.

Figure 1F:
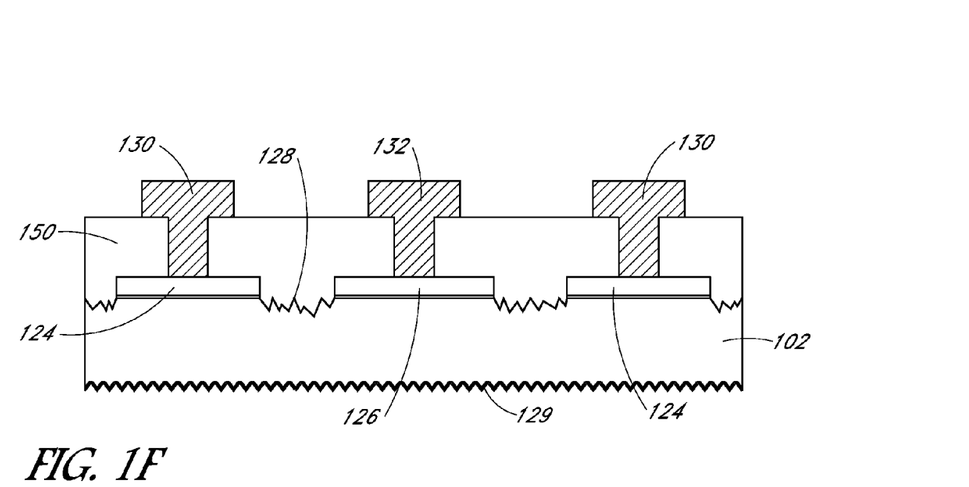

Referring to FIG. 1F, conductive contacts 130 and 132 are fabricated to contact the first 124 and second 126 doped polycrystalline silicon emitter regions, respectively. In an embodiment, the contacts are fabricated by first depositing and patterning an insulating layer 150 to have openings and then forming one or more conductive layers in the openings. In an embodiment, the conductive contacts 130 and 132 include metal and are formed by a deposition, lithographic, and etch approach or, alternatively, a printing process.

In one embodiment, the capping layers 114 and 122 (or at least remnants thereof) are retained in the final structure. In one such embodiment, the contacts 130 and 132 are formed through the capping layers 114 and 122, e.g., by patterning the capping layers during the contact trench formation. However in another alternative embodiment, one or both of the capping layers 114 and 122 include a refractory metal such as, but not limited to, titanium (Ti), zirconium (Zr), hafnium (Hf), niobium (Nb), tantalum (Ta), molybdenum (Mo) or tungsten (W). Such a refractory metal can be deposited onto a polycrystalline silicon surface and withstand an anneal process used to activate dopants in the polycrystalline silicon layer. In other embodiments, a thin metal capping layer is used and includes a material such as, but not limited to, titanium (Ti), cobalt (Co) or nickel (Ni). The thin metal capping layer can be used to undergo silicidation with an upper portion of the polycrystalline layer. In an embodiment, the conductive contacts 130 and 132 are formed to include the conductive capping layers. In yet another alternative embodiment, one or both of the capping layers 114 and 122 include a surface carbosilane based film having a thickness between 50 and 1000 A and deposited using chemical vapor deposition techniques employing volatile carbosilane precursors. Such a layer can be removed or patterned prior to conductive contact formation.

Figure 3:
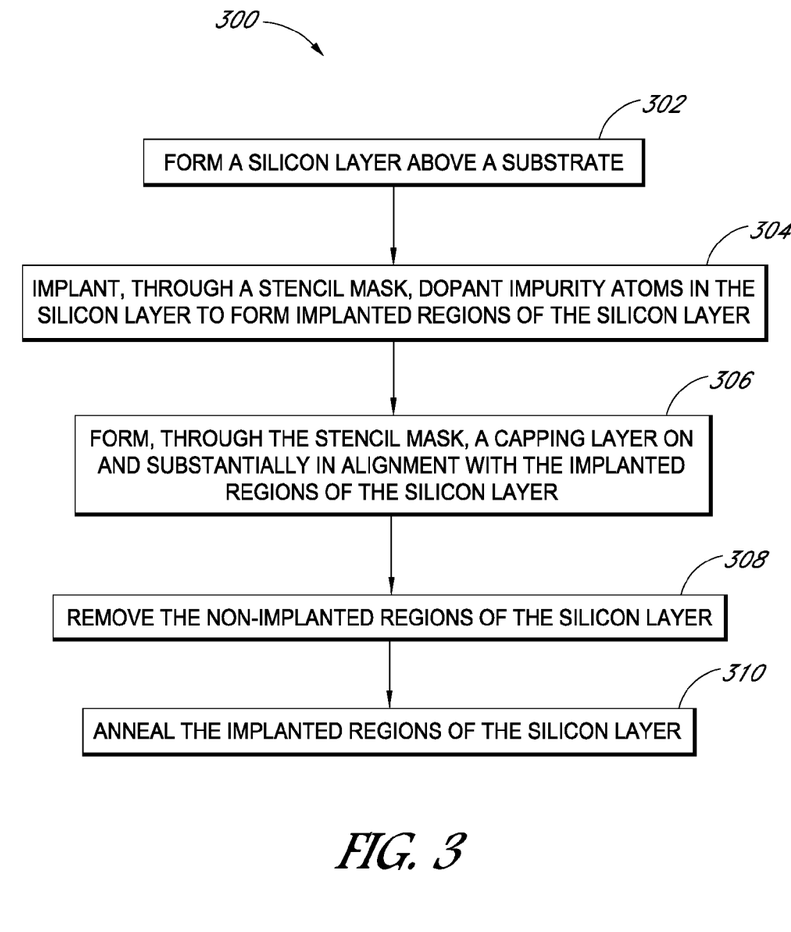
FIG. 3 is a flowchart listing operations in another method of fabricating a solar cell, in accordance with an embodiment of the present disclosure.

It is to be appreciated that such a stencil mask based approach to self-aligned implant and capping regions and layers can be used for only one dopant type instead of for both dopant types. For example, the process may be particularly advantageous for one of P+ or N+ doping and is thus only used for fabrication of one of the two conductivity types of emitter regions. As an example, FIG. 3 is a flowchart 300 listing operations in another method of fabricating a solar cell, in accordance with an embodiment of the present disclosure.

Referring to operation 302 of flowchart 300, a method of fabricating an emitter region of a solar cell involves forming a silicon layer above a substrate. Referring to operation 304 of flowchart 300, through a stencil mask, dopant impurity atoms are implanted in the silicon layer to form implanted regions of the silicon layer with adjacent non-implanted regions. Referring to operation 306 of flowchart 300, through the stencil mask, a capping layer is formed on and substantially in alignment with the implanted regions of the silicon layer. Referring to operation 308 of flowchart 300, the non-implanted regions of the silicon layer are removed. The capping layer protects the implanted regions of the silicon layer during the removing. Referring to operation 310 of flowchart 300, the implanted regions of the silicon layer are annealed to form doped polycrystalline silicon emitter regions.

Figure 4:
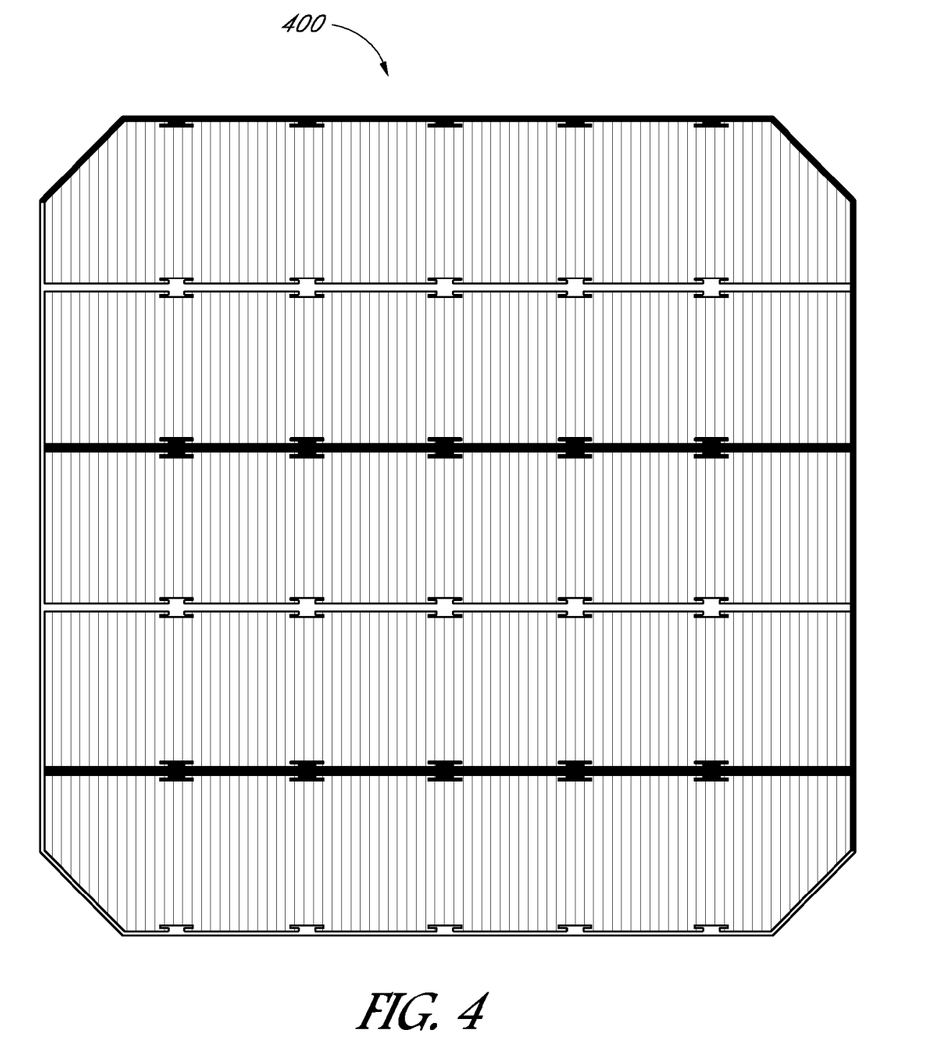
FIG. 4 illustrates a plan of a back surface of an aluminum metallization back contact solar cell, in accordance with an embodiment of the present disclosure.

The above described processes can be used to enable patterned boron (or phosphorus or arsenic, etc.) implant and cap through a laser cut Si mask. The approach involves integrating implant with cap to address coefficient of temperature expansion (CTE) mismatch, contamination, and/or cleaning challenges. Approaches may be suitable for current solar cell designs. However, in one embodiment, mask integrity requirements may favor designs with reduced finger dimensions, such as a design fabricated to for an all Al metallization cell. As an example, FIG. 4 illustrates a plan of a back surface of an aluminum metallization back contact solar cell 400, in accordance with an embodiment of the present disclosure.

As described briefly above, the processes referred to herein may be performed on an in-line process apparatus. As an example, FIG. 5A schematically illustrates a cross-sectional view of an inline platform for patterned implant and capping, in accordance with an embodiment of the present disclosure. FIG. 5B illustrates an implant and capping sequence through silicon contact masks in the apparatus of FIG. 5A, in accordance with an embodiment of the present disclosure.

Referring to FIG. 5A, an in-line process apparatus 500 for fabricating an emitter region of a solar cell includes a first station 502 for aligning a stencil mask 504 with a substrate 506. A second station 508 is included for implanting dopant impurity atoms (e.g., boron or phosphorus) above the substrate 506, through the stencil mask 504. A third station 510 is included for forming a capping layer above the substrate 506, through the stencil mask 504. Other aspects of the in-line process apparatus 500 can include a wafer input area 512 and a mask removal and wafer output area 514.

In an embodiment, the stencil mask 504 and the substrate 506 are moved together at least through the second 508 and third 510 stations. The direction of wafer flow through the in-line process apparatus 500 is shown by arrows 550. Referring to FIG. 5B, in an embodiment, the in-line process apparatus 500 enables implant and capping or regions of a silicon layer 507 on the substrate 506 through the stencil mask 504. The implanted regions 507A and the capping layer 509 are self-aligned since the capping layer is formed using the same mask in the same position as is used to perform the implanting. In an embodiment, the first station 502 is for aligning the stencil mask 504 as in contact with on or in close proximity to the substrate 506. In an embodiment, the second station 508 includes an ion-implantation or plasma immersion implantation chamber. In an embodiment, the third station 510 includes a deposition chamber such as, but not limited to, a low pressure chemical vapor deposition (LPCVD), a plasma enhanced chemical vapor deposition (PECVD) chamber, a high density plasma chemical vapor deposition (HDPCVD) chamber, or a physical vapor deposition (PVD) chamber.

Figure 6A:
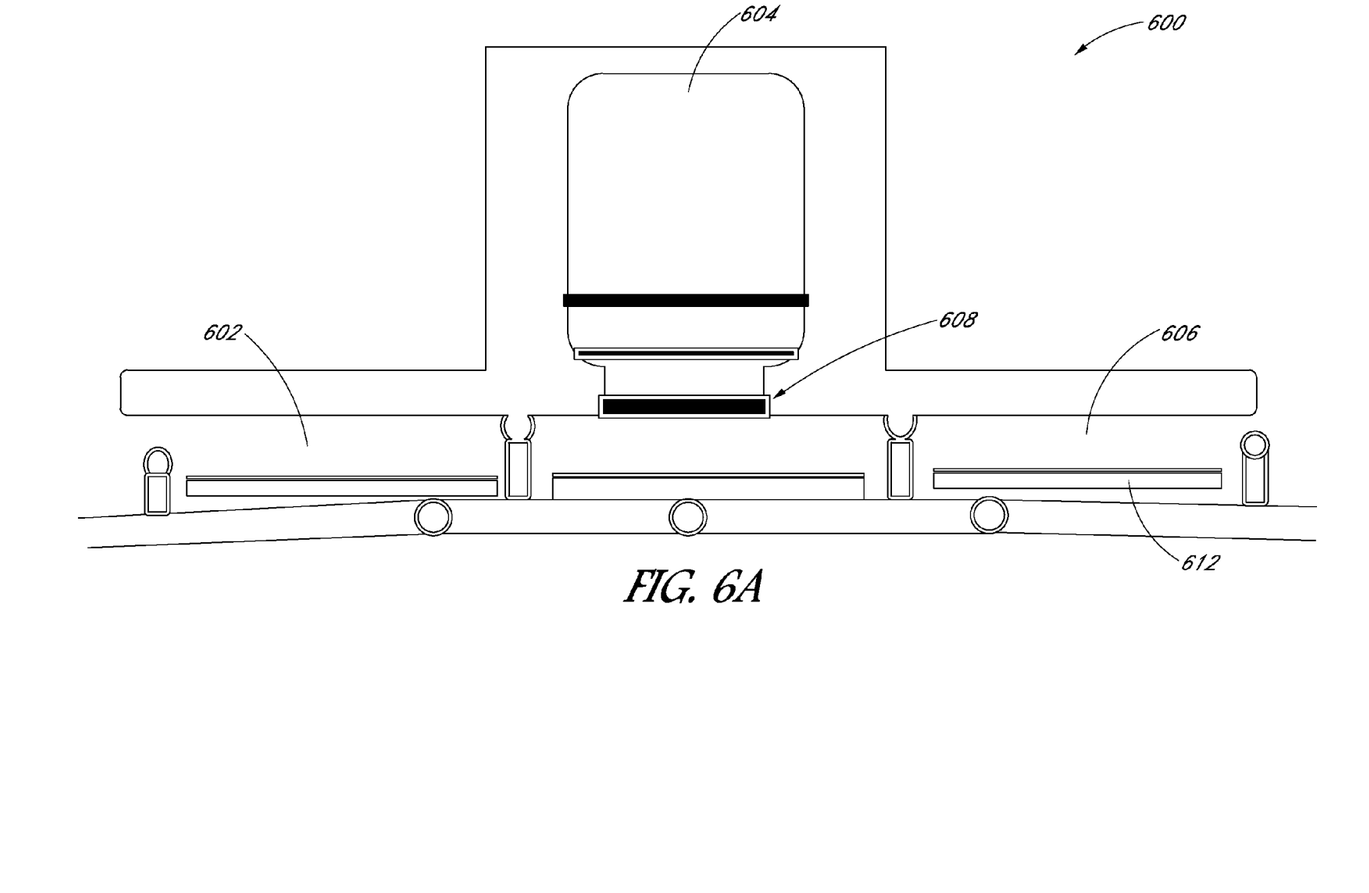
FIG. 6A schematically illustrates a cross-sectional view of an inline platform for patterned implant involving traveling wafer and stationary shadow mask, in accordance with an embodiment of the present disclosure.
Figure 6B:
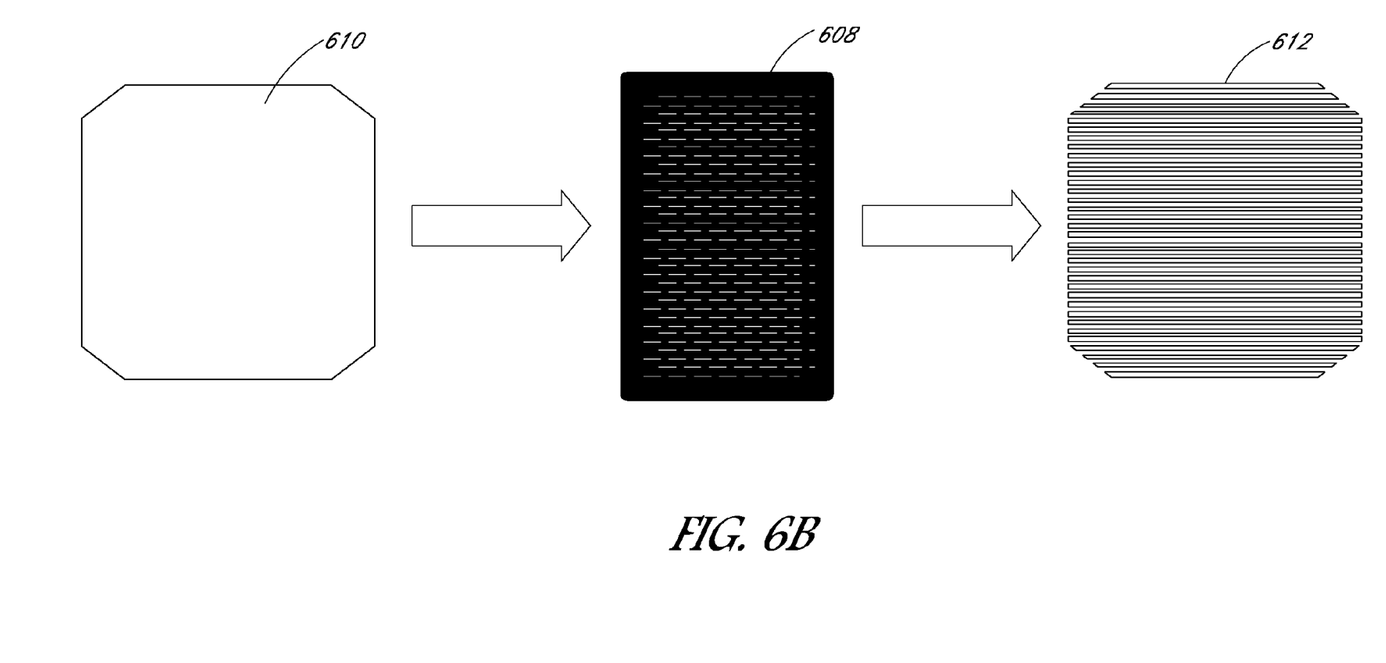
FIG. 6B illustrates an implant sequence through graphite proximity masks in the apparatus of FIG. 6A, in accordance with an embodiment of the present disclosure.

In alternative embodiments, other stencil masks that may be contaminating for a silicon substrate may be used, so long as contact is not made between the mask and the substrate. For example, a graphite shadow mask may be used. Furthermore, in other embodiments, the stencil mask does not travel with the substrate. As an example of both alternatives, FIG. 6A schematically illustrates a cross-sectional view of an inline platform for patterned implant involving traveling wafer and stationary shadow mask, in accordance with an embodiment of the present disclosure. FIG. 6B illustrates an implant sequence through graphite proximity masks in the apparatus of FIG. 6A, in accordance with an embodiment of the present disclosure. Referring to FIG. 6A, an inline platform 600 includes a wafer input region 602, an implant source 604 (e.g., ion implantation or plasma immersion), and an output region 606. A stationary stencil mask 608, such as a stationary graphite mask, is held in proximity to, but not in contact with, a substrate 610 to provide an implanted substrate 612.

Figure 7A:
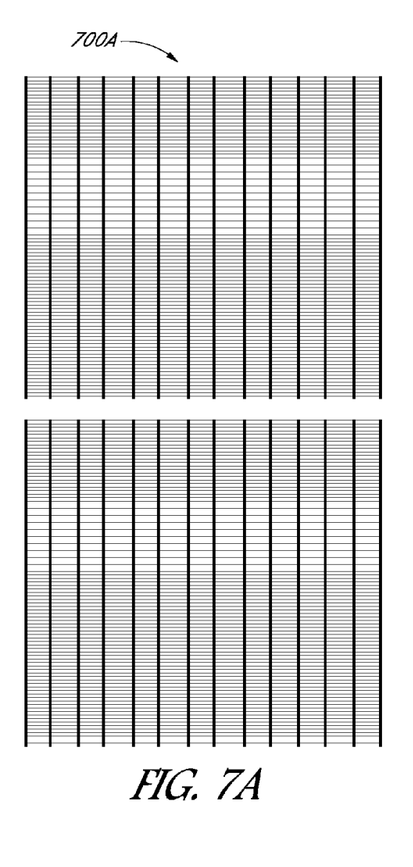
FIG. 7A illustrates a plan view of the back side of an interdigitated back contact (IBC) solar cell having an adjacent "Short Finger" multibusbar layout, in accordance with an embodiment of the present disclosure.
Figure 7B:
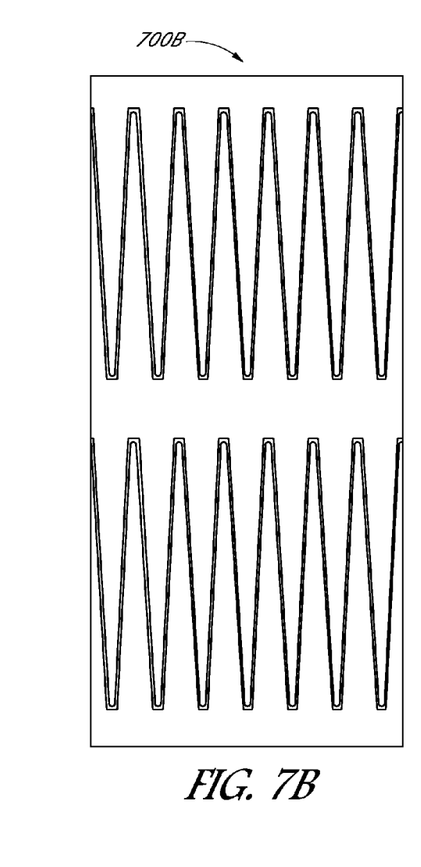
FIG. 7B illustrates a plan view of the back side of an IBC solar cell having a metal foil backplane of copper (Cu) or aluminum (Al), in accordance with an embodiment of the present disclosure.
Figure 7C:
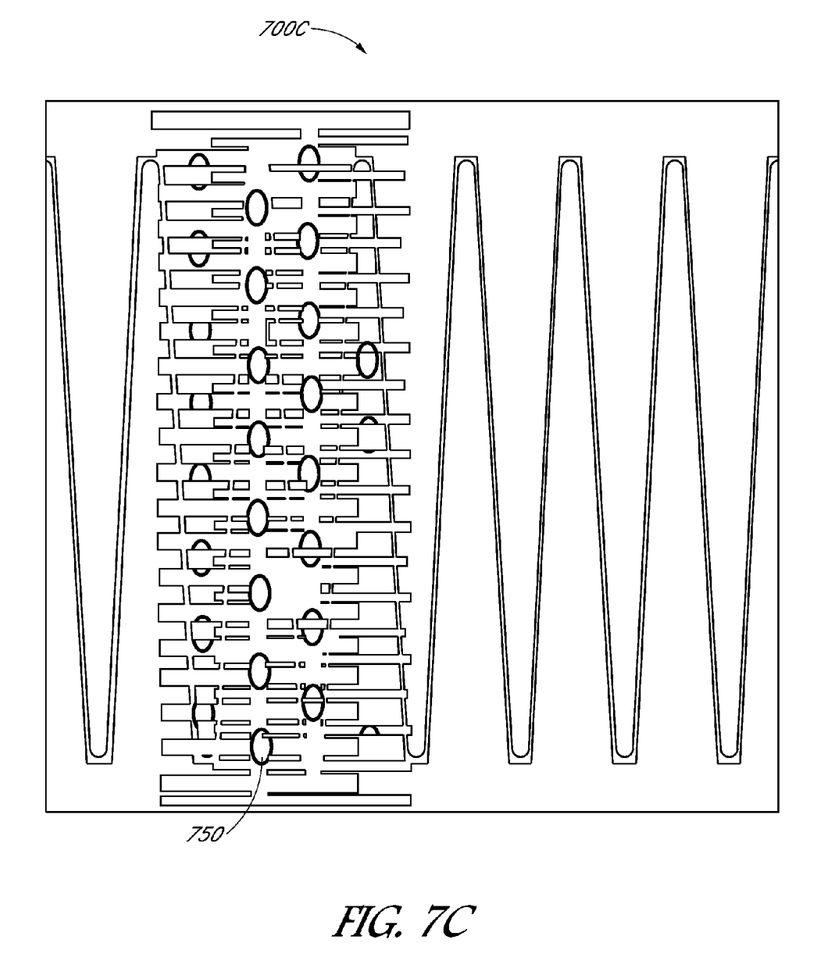
FIG. 7C illustrates a plan view of the back side of an IBC solar cell having multiple contact points attached with solder, a conductive adhesive or by laser spot welding (e.g., Al to Al), in accordance with an embodiment of the present disclosure.

As described briefly in association with FIG. 4, in an embodiment, mask integrity may favor solar cell designs with reduced finger dimensions, e.g., for interdigitated back contact (IBC) cells with thin wafer contact metal. Provided as examples, FIG. 7A illustrates a plan view of the back side of an IBC solar cell 700A having an adjacent "Short Finger" multibusbar layout, in accordance with an embodiment of the present disclosure. FIG. 7B illustrates a plan view of the back side of an IBC solar cell 700B having a metal foil backplane of copper (Cu) or aluminum (Al), in accordance with an embodiment of the present disclosure. FIG. 7C illustrates a plan view of the back side of an IBC solar cell 700C having multiple contact points 750 attached with solder, a conductive adhesive or by laser spot welding (e.g., Al to Al), in accordance with an embodiment of the present disclosure.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. Furthermore, it is to be understood that, where N+ and P+ type doping is described specifically, other embodiments contemplated include the opposite conductivity type, e.g., P+ and N+ type doping, respectively.

In general, embodiments described herein may be implemented to provide lower cost, high throughput ion implant platforms for the fabrication of high efficiency IBC-type solar cells. Specific embodiments can offer an advantageous approach for generating self-aligned implants and capping layers through a single Si contact stencil mask. In addition, to ensure implanted areas and capping films are automatically self-aligned, the combination of Si stencil masks with a process that automatically applies a dielectric capping film can address many of the cost, contamination, lifetime, and cleaning/reuse issues generally limiting the application of implant technology to solar cell fabrication. In addition to providing a self-aligned cap to serve as an etch mask for trench removal, the deposition of a capping film without breaking vacuum can reduce the degradation of implanted regions by air oxidation. Embodiments may be particularly useful for the fabrication of solar cells that incorporate polycrystalline silicon or amorphous silicon (e.g., a-Si:H) derived emitters.

Thus, methods of fabricating solar cell emitter regions using self-aligned implant and cap, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating an emitter region of a solar cell, the method comprising:
    forming a silicon layer above a substrate, the silicon layer distinct from the substrate;
    implanting, through a stencil mask, dopant impurity atoms in the silicon layer to form implanted regions of the silicon layer with adjacent non-implanted regions;
    forming, through the stencil mask, a capping layer on and substantially in alignment with the implanted regions of the silicon layer;
    removing the non-implanted regions of the silicon layer, wherein the capping layer protects the implanted regions of the silicon layer during the removing, and wherein removing the non-implanted region of the silicon layer comprises removing only the non-implanted region of the silicon layer and retaining the implanted regions of the silicon layer;
    annealing the implanted regions of the silicon layer to form doped polycrystalline silicon emitter regions from the implanted regions of the silicon layer; and
    forming conductive contacts on the doped polycrystalline silicon emitter regions.

2. The method of claim 1, wherein the implanting through the stencil mask comprising implanting through a silicon stencil mask, and wherein the silicon stencil mask is positioned on or in close proximity to the silicon layer.

3. The method of claim 1, wherein the implanting and the forming the capping layer are performed in an in-line process apparatus in which the stencil mask and the substrate are moved together through the in-line process apparatus.

4. The method of claim 1, wherein the implanting and the forming the capping layer are performed using a stationary graphite stencil mask.

5. The method of claim 1, wherein forming the capping layer comprises using a deposition technique selected from the group consisting of low pressure chemical vapor deposition (LPCVD), plasma enhanced chemical vapor deposition (PECVD), high density plasma chemical vapor deposition (HDPCVD) and physical vapor deposition (PVD).

6. The method of claim 1, wherein forming the capping layer comprises depositing at a temperature approximately in the range of 25-400 degrees Celsius.

7. The method of claim 1, wherein forming the capping layer comprises forming a material selected from the group consisting of silicon dioxide ($SiO_2$), silicon nitride (SiN) and silicon oxynitride (SiON).

8. The method of claim 1, further comprising:
    removing the capping layer prior to forming the conductive contacts on the doped polycrystalline silicon emitter regions.

9. The method of claim 8, wherein removing the non-implanted regions of the silicon layer comprises using a hydroxide-based wet etch process, and wherein removing the capping layer comprises using an HF-based wet etch process.

10. The method of claim 1, wherein forming the conductive contacts on the doped polycrystalline silicon emitter regions comprises forming the conductive contacts comprising at least a portion of the capping layer.

11. The method of claim 10, wherein forming the capping layer comprises forming a metal selected from the group consisting of titanium (Ti), zirconium (Zr), hafnium (Hf), niobium (Nb), tantalum (Ta), molybdenum (Mo) or tungsten (W), nickel (Ni) and cobalt (Co).

12. A method of fabricating alternating N-type and P-type emitter regions of a solar cell, the method comprising:
    forming a polycrystalline silicon layer on a thin oxide layer disposed on a monocrystalline silicon substrate, the polycrystalline silicon layer distinct from the monocrystalline silicon substrate;
    implanting, through a first stencil mask, dopant impurity atoms of a first conductivity type in the polycrystalline silicon layer to form first implanted regions of the polycrystalline silicon layer adjacent to non-implanted regions;
    forming, through the first stencil mask, a first capping layer on and substantially in alignment with the first implanted regions of the polycrystalline silicon layer;
    implanting, through a second stencil mask, dopant impurity atoms of a second, opposite, conductivity type in portions of the non-implanted regions of the polycrystalline silicon layer to form second implanted regions of the polycrystalline silicon layer and resulting in remaining non-implanted regions;
    forming, through the second stencil mask, a second capping layer on and substantially in alignment with the second implanted regions of the polycrystalline silicon layer;
    removing the remaining non-implanted regions of the polycrystalline silicon layer, wherein the first and second capping layers protect the first implanted regions and the second implanted regions, respectively, of the polycrystalline silicon layer during the removing, and wherein removing the non-implanted region of the polycrystalline silicon layer comprises removing only the non-implanted region of the polycrystalline silicon layer and retaining the first and second implanted regions of the polycrystalline silicon layer;
    annealing the first implanted regions and the second implanted regions of the polycrystalline silicon layer to form doped polycrystalline silicon emitter regions from the first and second implanted regions of the polycrystalline silicon layer; and
    forming conductive contacts on the doped polycrystalline silicon emitter regions.

13. The method of claim 12, wherein the implanting through the first and second stencil masks comprises implanting through silicon stencil masks, and wherein the first and second silicon stencil masks are sequentially positioned on or in close proximity to the polycrystalline silicon layer.

14. The method of claim 12, wherein the implanting and the forming the first and second capping layers are performed in one or more in-line process apparatuses in which one of the first and second stencil masks and the monocrystalline silicon substrate are moved together through the one or more in-line process apparatuses.

15. The method of claim 12, wherein the implanting and the forming the first capping layer are performed using a first stationary graphite stencil mask, and wherein the implanting and the forming the second capping layer are performed using a second stationary graphite stencil mask.

16. The method of claim 12, wherein removing the remaining non-implanted regions of the polycrystalline silicon layer comprises using a hydroxide-based wet etch process, and wherein the first and second capping layers comprise a material selected from the group consisting of silicon dioxide ($SiO_2$), silicon nitride (SiN) and silicon oxynitride (SiON), the method further comprising:
    removing the first and second capping layers using an HF-based wet etch process prior to forming the conductive contacts on the doped polycrystalline silicon emitter regions.

17. The method of claim 12, wherein the capping layer comprises a metal selected from the group consisting of titanium (Ti), zirconium (Zr), hafnium (Hf), niobium (Nb), tantalum (Ta), molybdenum (Mo) or tungsten (W), nickel (Ni) and cobalt (Co), and forming the conductive contacts on the doped polycrystalline silicon emitter regions comprises forming the conductive contacts each comprising one of the first or second capping layers.

* * * * *